(12) United States Patent
Pupin et al.

(10) Patent No.: US 11,695,226 B2
(45) Date of Patent: Jul. 4, 2023

(54) MAGNETIC CONNECTOR AND GROUP OF MAGNETIC CONNECTORS

(71) Applicant: Schneider Electric Industries SAS, Rueil-Malmaison (FR)

(72) Inventors: Thomas Pupin, Grenoble (FR); Simon Tian, Eybens (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 89 days.

(21) Appl. No.: 17/165,404

(22) Filed: Feb. 2, 2021

(65) Prior Publication Data

US 2021/0257757 A1 Aug. 19, 2021

(30) Foreign Application Priority Data

Feb. 13, 2020 (FR) ...................................... 2001422

(51) Int. Cl.
*H01R 13/62* (2006.01)
*H01R 11/30* (2006.01)
*H01H 71/02* (2006.01)
*H01R 13/64* (2006.01)

(52) U.S. Cl.
CPC ............ *H01R 11/30* (2013.01); *H01H 71/02* (2013.01); *H01R 13/6205* (2013.01); *H01R 13/64* (2013.01)

(58) Field of Classification Search
CPC .... H01R 11/30; H01R 13/6205; H01R 13/64; H01H 71/02
See application file for complete search history.

(56) References Cited

U.S. PATENT DOCUMENTS

| | | | | |
|---|---|---|---|---|
| 3,521,216 A | * | 7/1970 | Tolegian | H01R 13/6205 439/675 |
| 3,808,577 A | * | 4/1974 | Mathauser | H01R 13/6205 439/246 |
| 4,025,964 A | * | 5/1977 | Owens | A61M 39/0247 439/39 |
| 4,112,941 A | * | 9/1978 | Larimore | A61B 5/274 439/153 |
| 5,829,987 A | * | 11/1998 | Fritsch | H01R 13/7037 200/51.09 |

(Continued)

FOREIGN PATENT DOCUMENTS

| | | |
|---|---|---|
| JP | H0734562 U | 6/1995 |
| JP | 2007073477 A | 3/2007 |

(Continued)

OTHER PUBLICATIONS

French Search Report and Written Opinion for French Patent Application No. FR2001422 dated Oct. 22, 2020, 9 pages.

*Primary Examiner* — Thanh Tam T Le
(74) *Attorney, Agent, or Firm* — Locke Lord LLP

(57) ABSTRACT

A magnetic connector for connecting an electrical unit to an electrical consumer unit includes at least one magnet, a conductive metal part secured to this magnet, a connecting cable fixed to the conductive metal part, and a cap made of plastic material overmoulded on the connecting cable, the conductive metal part and the magnet, except for a contact surface of the magnet intended to make contact with a metal part of the electrical consumer unit.

11 Claims, 11 Drawing Sheets

(56) References Cited

U.S. PATENT DOCUMENTS

| | | | | |
|---|---|---|---|---|
| 6,638,076 B2* | 10/2003 | Wang | H01R 13/6205 | 439/39 |
| 6,808,405 B1* | 10/2004 | Uratani | H01R 13/7037 | 439/39 |
| 7,121,868 B2* | 10/2006 | Peterson | H01R 4/5083 | 439/371 |
| 7,341,458 B1* | 3/2008 | Koh | H01R 13/2421 | 439/39 |
| 7,736,187 B2* | 6/2010 | Yaworski | H01H 85/0021 | 439/620.26 |
| 7,775,801 B2* | 8/2010 | Shift | H01R 13/6205 | 439/700 |
| 7,841,897 B2* | 11/2010 | Blake | H01R 24/542 | 439/579 |
| 8,888,500 B2* | 11/2014 | Gao | H01R 13/2457 | 439/700 |
| 9,112,303 B2* | 8/2015 | Zeliff | H01R 11/30 | |
| 9,300,083 B2* | 3/2016 | Bosscher | H02J 50/10 | |
| 9,806,458 B1* | 10/2017 | Chiu | H01R 13/40 | |
| 10,004,141 B2* | 6/2018 | Hackert | A47J 43/07 | |
| 10,056,713 B2* | 8/2018 | Watkins | H01R 13/6205 | |
| 10,079,455 B2* | 9/2018 | He | H01R 13/64 | |
| 10,177,491 B2* | 1/2019 | Davies | H01R 13/6205 | |
| 10,297,950 B2* | 5/2019 | Wei | A41D 13/0051 | |
| 2007/0259536 A1* | 11/2007 | Long | H01R 31/06 | 439/39 |
| 2016/0344117 A1 | 11/2016 | Kim | | |
| 2017/0365952 A1 | 12/2017 | He | | |

FOREIGN PATENT DOCUMENTS

| | | |
|---|---|---|
| KR | 20140013773 A | 2/2014 |
| WO | 2017211041 A1 | 12/2017 |

* cited by examiner

MAGNETIC CONNECTOR AND GROUP OF MAGNETIC CONNECTORS

TECHNICAL FIELD

The present invention relates to a magnetic connector for connecting an electrical unit to an electrical consumer unit. The invention also relates to a group of connectors comprising such magnetic connectors.

BACKGROUND

For various uses, notably for measuring energy consumption, temperature measures, electrical testing or supplying electrical power to miscellaneous electrical units, it is sometimes necessary to connect a cable to a voltage source of an electrical consumer unit, for example a circuit breaker screw. Usually, it is necessary to unscrew a screw and to rescrew it after having fitted an electrical cable to obtain the current. This operation is impractical and unreliable, all the more so when the space available between the screws of the circuit breakers and the front cover of an electrical consumer unit is reduced.

SUMMARY

It is these drawbacks that the invention intends to remedy by proposing a magnetic connector allowing an electrical unit to be connected to an electrical consumer unit more easily and more reliably.

To this end, the invention relates to a magnetic connector for connecting an electrical unit to an electrical consumer unit. This magnetic connector is characterized in that it comprises at least one magnet, a conductive metal part secured to this magnet, a connecting cable fixed to the conductive metal part, and a cap made of plastic material overmoulded on the connecting cable, the conductive metal part and the magnet, except for a contact surface of the magnet intended to make contact with a metal part of the electrical consumer unit.

By virtue of the invention, the magnetic connector ensures both the mechanical securing and the electrical connection, simplifying the connection of electrical units.

According to advantageous but non-mandatory aspects of the invention, a magnetic connector can incorporate one or more of the following features, taken in any technically admissible combination:

- The connector comprises a single magnet of cylindrical form and having a circumferential groove in which the material of the cap made of plastic material is engaged.
- The connector comprises two magnets of reverse polarities.
- The two magnets are of semicylindrical form and separated from one another by a wall made of a single piece with the cap.
- The cap made of plastic material has a longitudinal part extending along a central axis and terminated by a flat surface parallel to the contact surface of said at least one magnet, and the cable is oriented transversely with respect to the longitudinal part and then encapsulated in a radial part of the cap which extends the flat surface.
- The longitudinal part comprises at least one peripheral gripping ridge provided in the extension of the radial part of the cap.
- The longitudinal part is of cylindrical form and has at least one longitudinal bulge so as to produce friction in a housing of the electrical consumer unit in which the connector is connected.
- The longitudinal part has an elliptical transverse profile of which the greatest dimension has a length, with respect to the smallest dimension, that is greater by 0.2 to 0.4 mm.
- The longitudinal dimension of the connector, taken between the contact surface of the magnet and the flat surface of the cap, is between 7 and 12 mm.

The invention also relates to a group of magnetic connectors, characterized in that it comprises at least two magnetic connectors as mentioned above, each of these magnetic connectors being intended to be connected to a metal part of the electrical consumer unit, and a link part to which each of these magnetic connectors is fixed with a predefined separation.

BRIEF DESCRIPTION OF THE DRAWINGS

The invention will be better understood and other advantages thereof will become more clearly apparent in light of the following description of a magnetic connector conforming to the principle thereof, given as a nonlimiting example with reference to the attached drawings in which.

DETAILED DESCRIPTION

Figure 1:
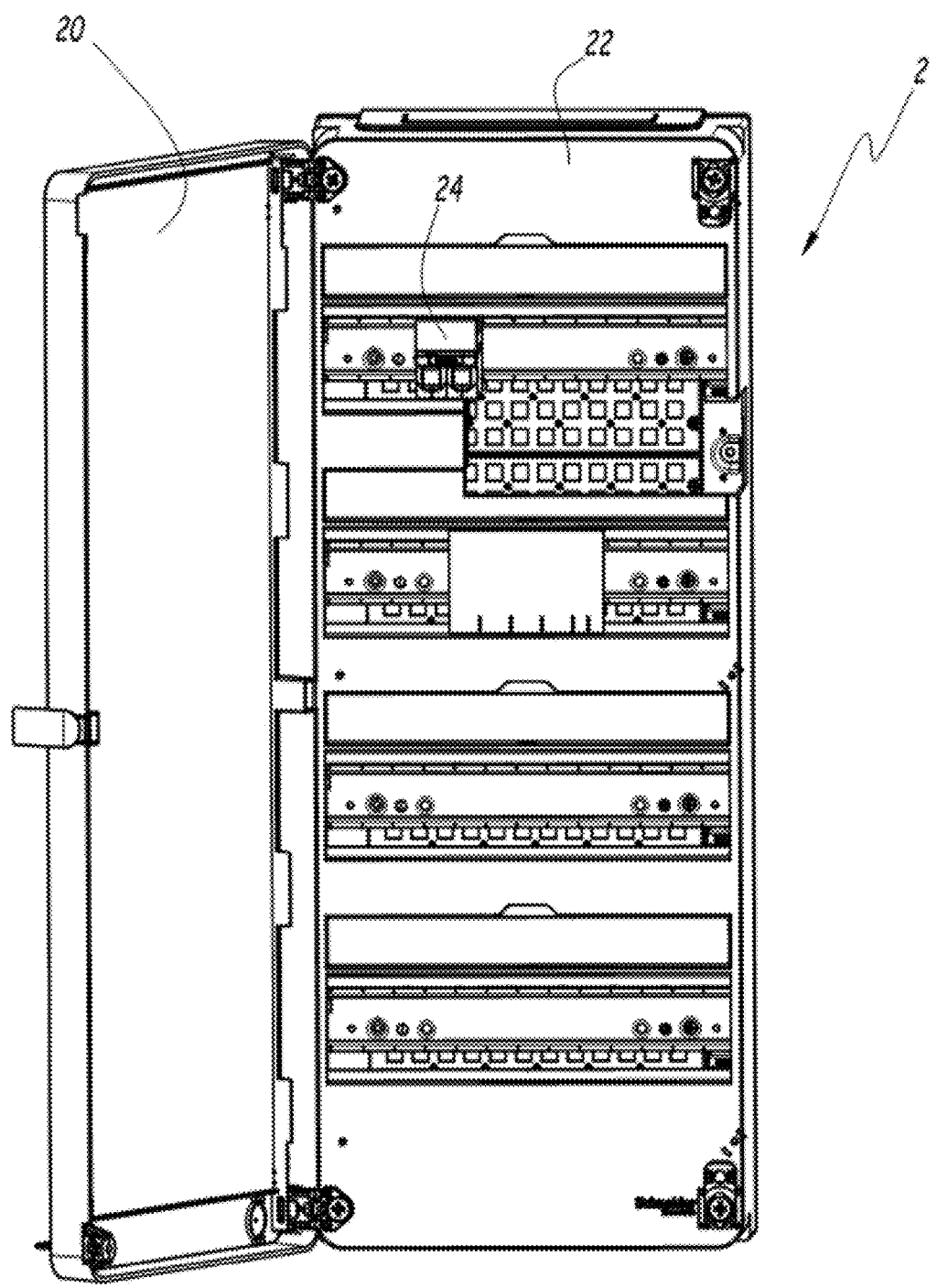
FIG. 1 is a perspective view of an open electrical consumer unit.
Figure 2:
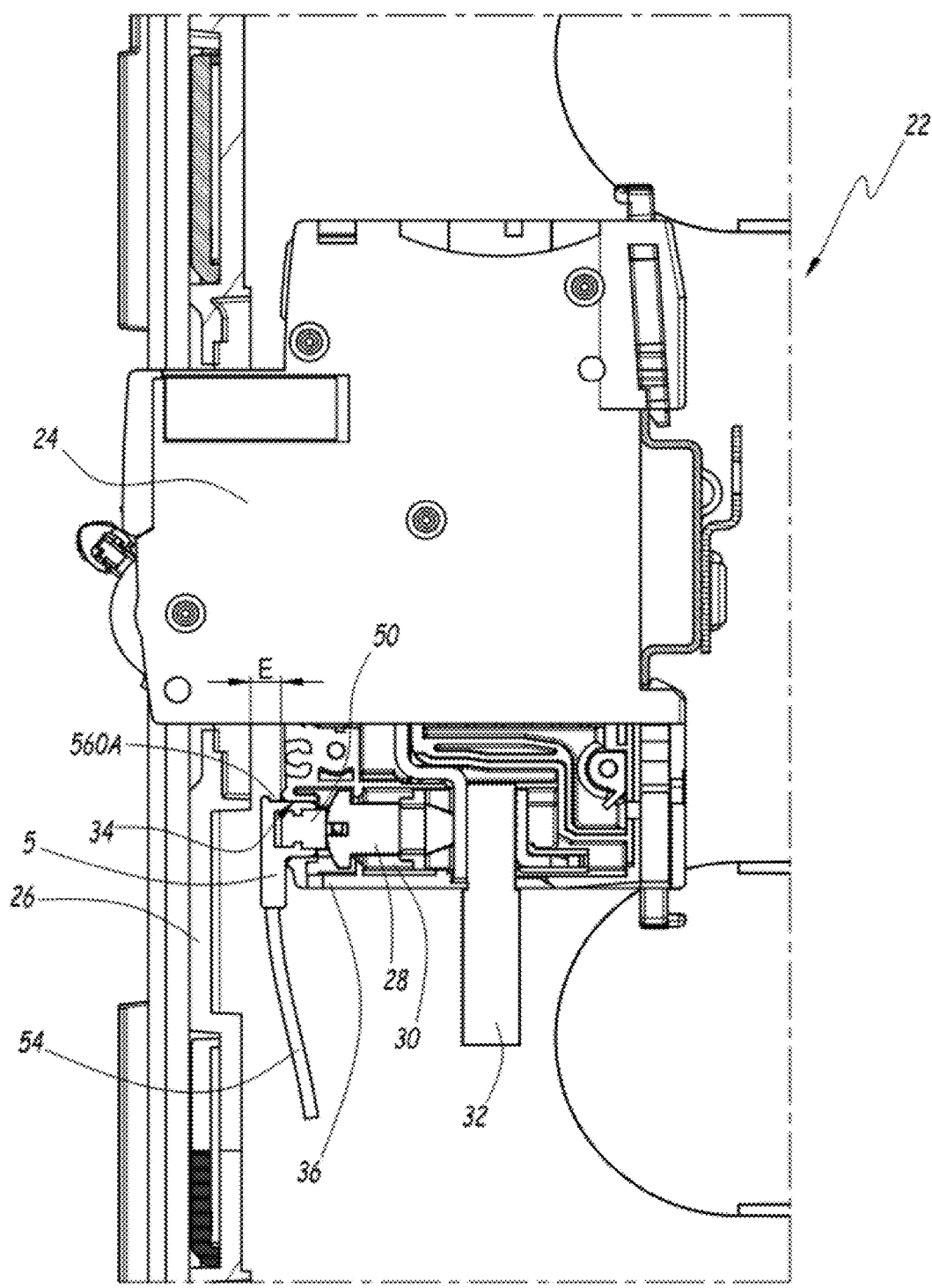
FIG. 2 is a cross section of the electrical consumer unit of FIG. 1 to which is connected a magnetic connector according to the invention.

FIGS. 1 and 2 represent an electrical cabinet 2, comprising a closing cover 20 and an electrical consumer unit 22. The electrical consumer unit 22 comprises a circuit breaker 24 and a protective cover 26 forming a front panel of the electrical consumer unit 22. The circuit breaker 24 is linked to several screws, of which at least one is represented in FIG. 2 with the reference 28, which are screwed onto electrical terminals 30, or cages, seen in cross section in FIG. 2, and which fix and electrically connect to cables 32 by which the circuit breaker 24 is supplied with electrical current. The screw 28 is inserted into a housing 34 of a socket 36 of the circuit breaker 24. The socket 36 is separated from an internal face of the protective cover 26 by a space E.

FIG. 2 represents a magnetic connector 5 for connecting an electrical unit (not represented), this magnetic connector 5 being connected to the electrical consumer unit 22, and more specifically to the screw 28.

Figure 3:
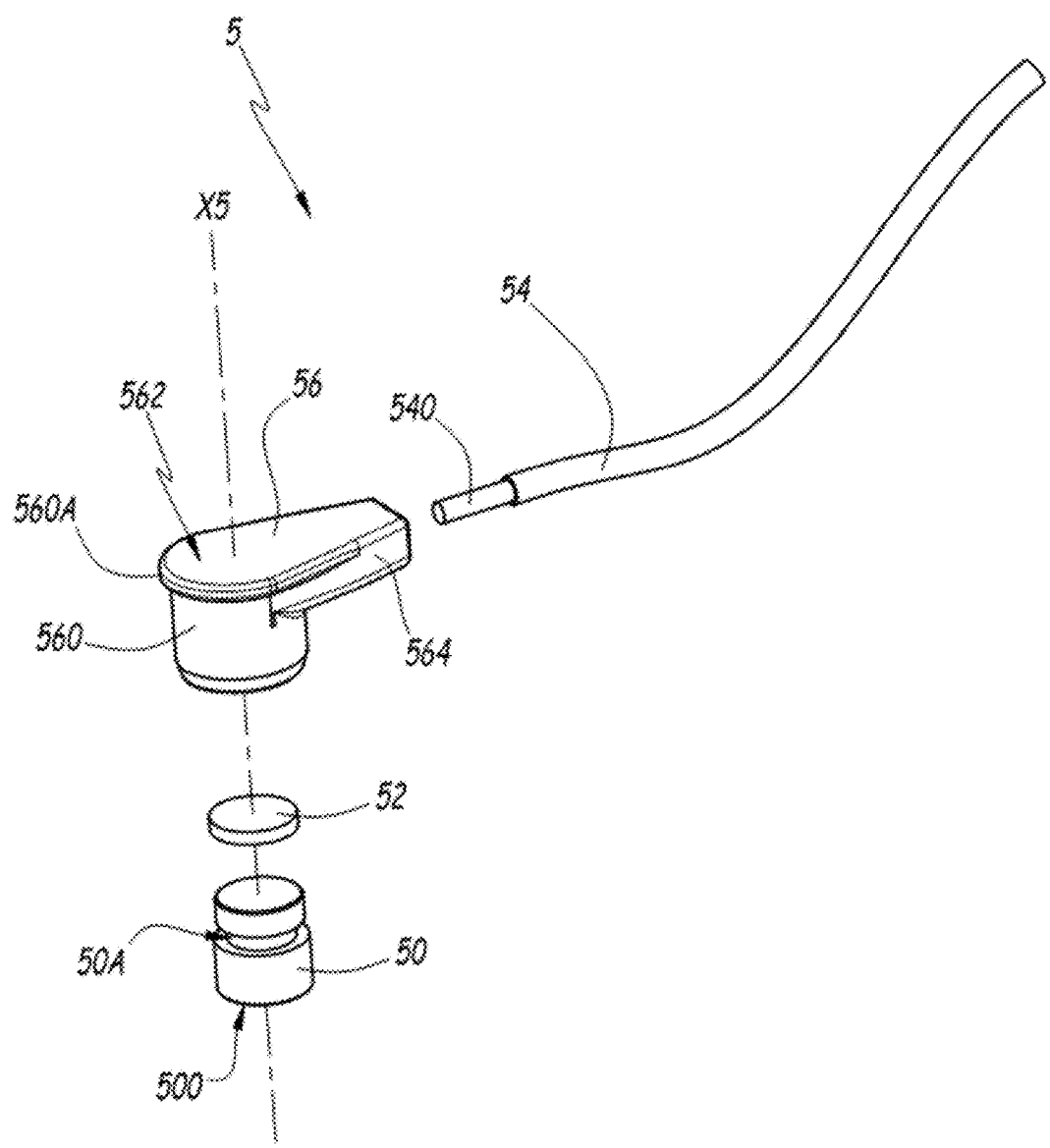
FIG. 3 is an exploded perspective view of a magnetic connector according to a first embodiment of the invention.

As can be seen in FIG. 3, the connector 5 comprises at least one magnet 50, a conductive metal part 52 secured to this magnet 50, a connecting cable 54 fixed to the conductive metal part 52, and a cap made of plastic material 56, overmoulded on the connecting cable 54, the conductive metal part 52 and the magnet 50, except for a contact surface 500 of the magnet 50, that is intended to make contact with the screw 28 of the electrical consumer unit 22.

The magnet 50 adheres to the screw 28 by virtue of the magnetic attraction between the screw 28 and the contact surface 500, which is flat. The magnet 50 therefore ensures the mechanical anchoring of the connector 5 on the screw 28.

According to a first embodiment represented in FIGS. 3 to 8, the magnetic connector 5 comprises a single magnet 50 of cylindrical form centred around a central axis X5. The contact surface 500 is of circular form and at right angles to the central axis X5.

The magnet 50 has a circumferential groove 50A in which the material of the cap made of plastic material 56 is engaged. This groove 50A makes it possible to reinforce the mechanical anchoring of the magnet 50 in the plastic cap 56.

The conductive metal part 52 has the form of a washer centred on the central axis X5. This part 52 is fixed to the magnet 50 by magnetic attraction. The conductive metal part 52 is preferably made of a paramagnetic metal material.

The connecting cable 54 has a stripped end 540 which is soldered onto the conductive metal part 52. Thus, there is an electrical continuity between the magnet 50, the conductive metal part 52 and the cable 54.

The cable 54 is linked to an electrical apparatus which is not represented, for example a voltage or temperature or other such detector.

The cap made of plastic material 56 has a longitudinal part 560 extending along the central axis X5 and terminated by a flat surface 562 parallel to the contact surface 500 of the magnet 50. The magnet 50 and the conductive metal part 52 are housed in this longitudinal part 560. The connecting cable 54 is oriented transversely with respect to the longitudinal part 560 and encapsulated in a radial part 564 of the cap 56, which extends the flat surface 562.

The longitudinal part 560 comprises at least one peripheral gripping ridge 560A provided in the extension of the radial part 564. This ridge 560A forms a protuberance of the longitudinal part 560 and allows a user to manipulate the connector 5, notably by passing his or her finger or fingernail under the ridge 560A to grip the connector 5, or to separate it from the screw 28. In a variant that is not represented, the connector 5 can have more than one ridge 560A, for example two parallel ridges.

The longitudinal part 560 is of cylindrical form centred on the central axis X5 and has at least one longitudinal bulge 560B so as to produce friction in the housing 34.

In this example, the longitudinal part 560 has two longitudinal bulges 560B diametrically opposite with respect to the central axis X5, formed by the fact that the longitudinal part 560 has an elliptical transverse profile, of which the greatest dimension L1 has a length, with respect to the smallest dimension L2, that is greater by 0.2 to 0.4 mm. The greatest dimension L1 here forms the greatest diameter of the ellipse formed by the base of the cylinder forming the longitudinal part 560, whereas the smallest dimension L2 corresponds to the smallest diameter. These longitudinal bulges 560B make it possible to reinforce the mechanical anchoring of the connector 5 in its housing 34 by friction, which is added to the magnetic attraction of the magnet 50. According to a variant which is not represented, the longitudinal bulges could also be formed by protuberances such as ridges.

The longitudinal dimension L5 of the connector 5, taken along the central axis X5 between the contact surface 500 and the flat surface 562, is preferably between 7 and 12 mm. This small bulk allows the magnetic connector 5 to be easily housed in an electrical consumer unit under the protective cover 26 in the space E. Also, the part of the connector 5 extending beyond the housing 34, that is to say the radial part 564 and its extension on the longitudinal part 560 surrounded by the ridge 560A, and the radial orientation of the cable 54, mean that the connector 5 has a small protruding height, which allows it to be housed in the space E.

Figure 4:
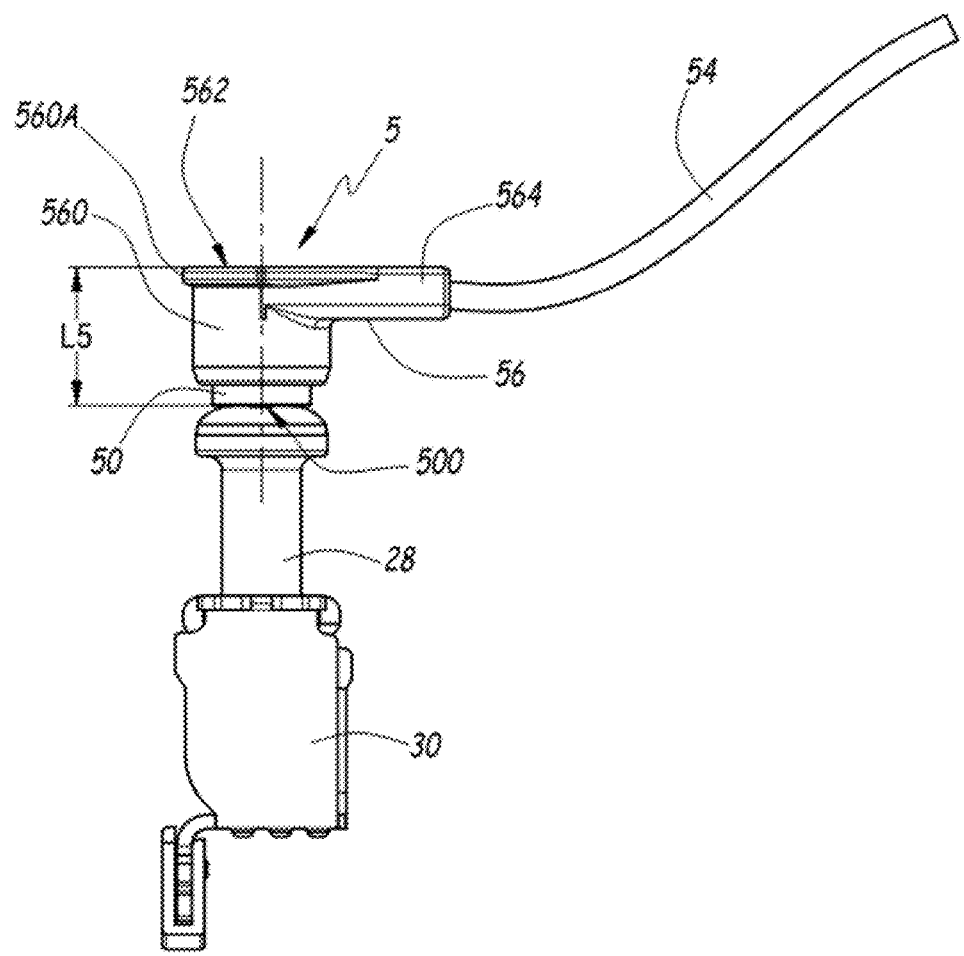
FIG. 4 is a side view of the magnetic connector of FIG. 3, connected to a screw of an electrical consumer unit.
Figure 5:
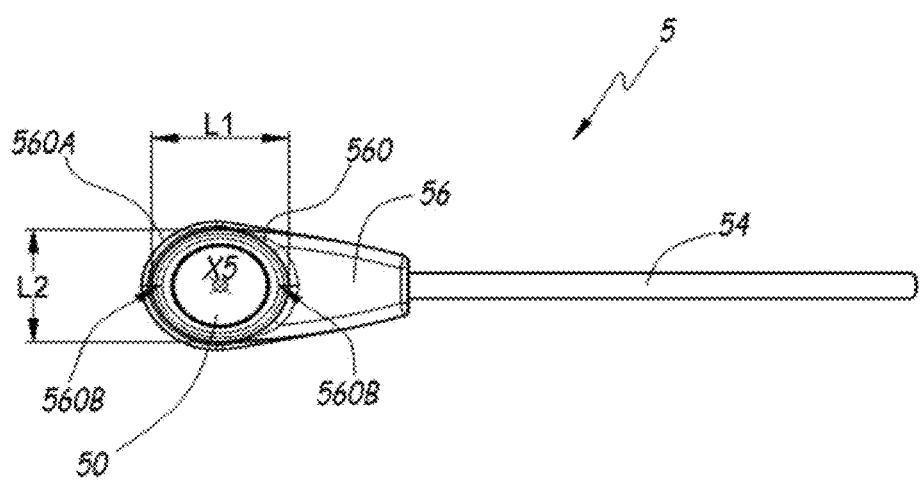
FIG. 5 is a bottom view of the magnetic connector of FIG. 3.

FIG. 4 shows the connecting of the connector 5 to the screw 28. The terminal 30 is seen uncut and without cable 32. A part of the magnet 50 which bears the contact surface 500 protrudes from the overmoulded cap 56 on the central axis X5. The magnet 50 and the screw 28 are subjected to a magnetic attraction force augmented by the friction force exerted by the bulges 560B in the housing 34, to give a mechanical holding force equivalent to a weight of between 500 g and 1 kg.

The electrical current is conducted between the terminal 30 and the screw 28. The electrical resistance of the terminal 30+screw 28 assembly is preferably between 0.1 and 0.3Ω. The electrical current is conducted between the head of the screw 28 and the magnet 50, with a contact resistance preferably of between 0.1 and 0.3Ω.

Figure 6:
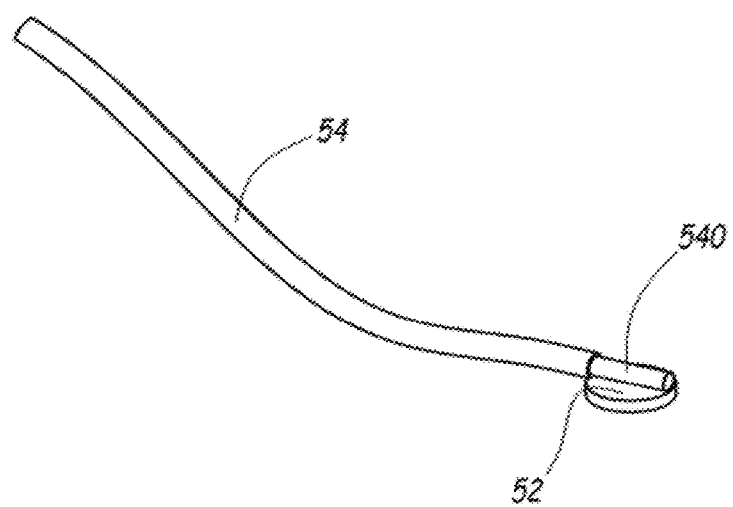
FIG. 6 is a perspective view of a first step of assembly of the magnetic connector of FIG. 3.
Figure 7:
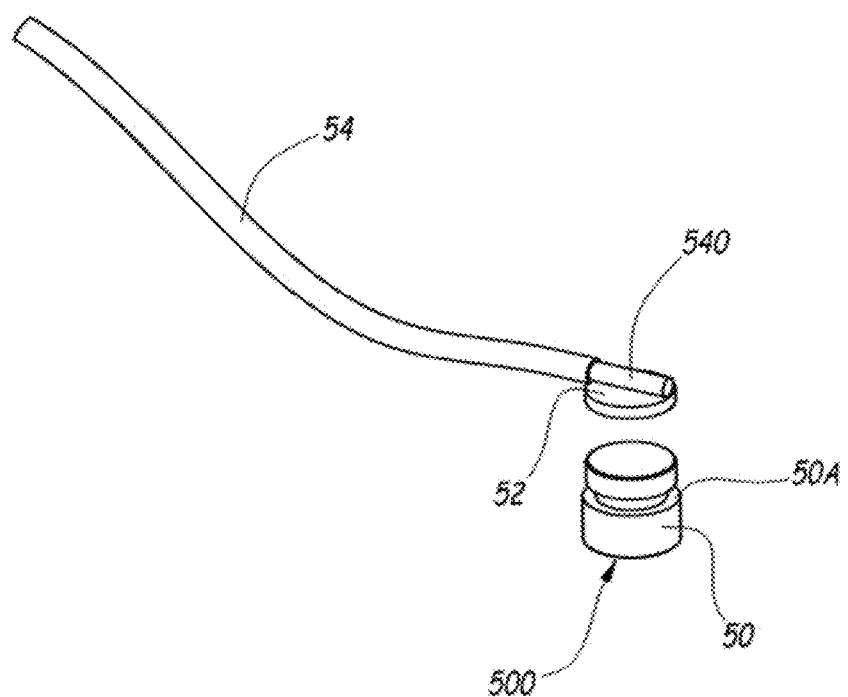
FIG. 7 represents a perspective view of a second step of assembly of the magnetic connector of FIG. 3.
Figure 8:
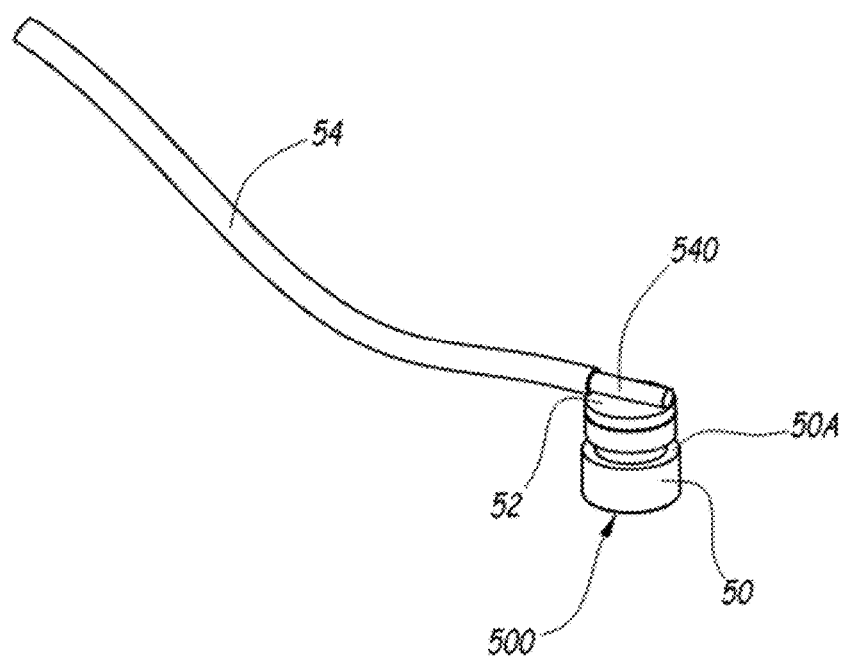
FIG. 8 represents a perspective view of a third step of assembly of the magnetic connector of FIG. 3.

FIGS. 6 to 8 represent a method for manufacturing the magnetic connector 5. In FIG. 6, the connecting cable 54 with its stripped part 540 is soldered onto the conductive metal part 52. In FIG. 7, the magnet 50 is fixed to the conductive metal part 52 by magnetic attraction. In FIG. 8, the assembly formed by the stripped part 540, the conductive metal part 52 and the magnet 50 is placed in an injection mould which is not represented, for example a low-pressure mould, into which the plastic material is injected to mould the plastic cap 56 and obtain the final connector 5 as it appears in FIG. 4.

Figure 9:
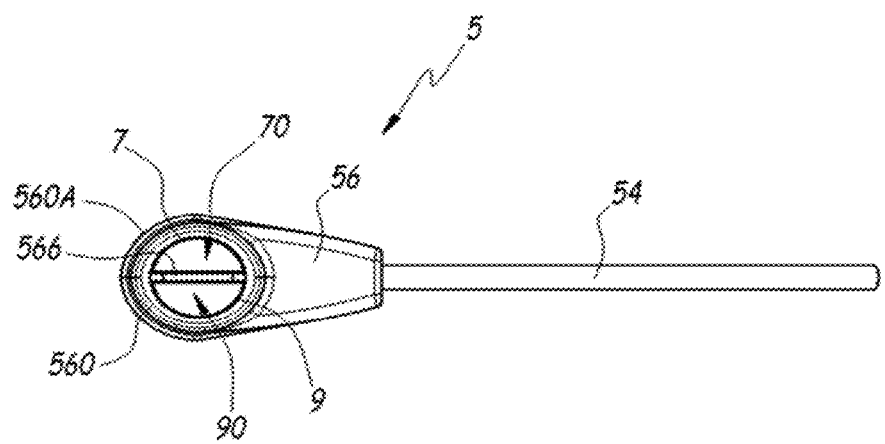
FIG. 9 is a bottom view of a magnetic connector according to a second embodiment of the invention.
Figure 10:
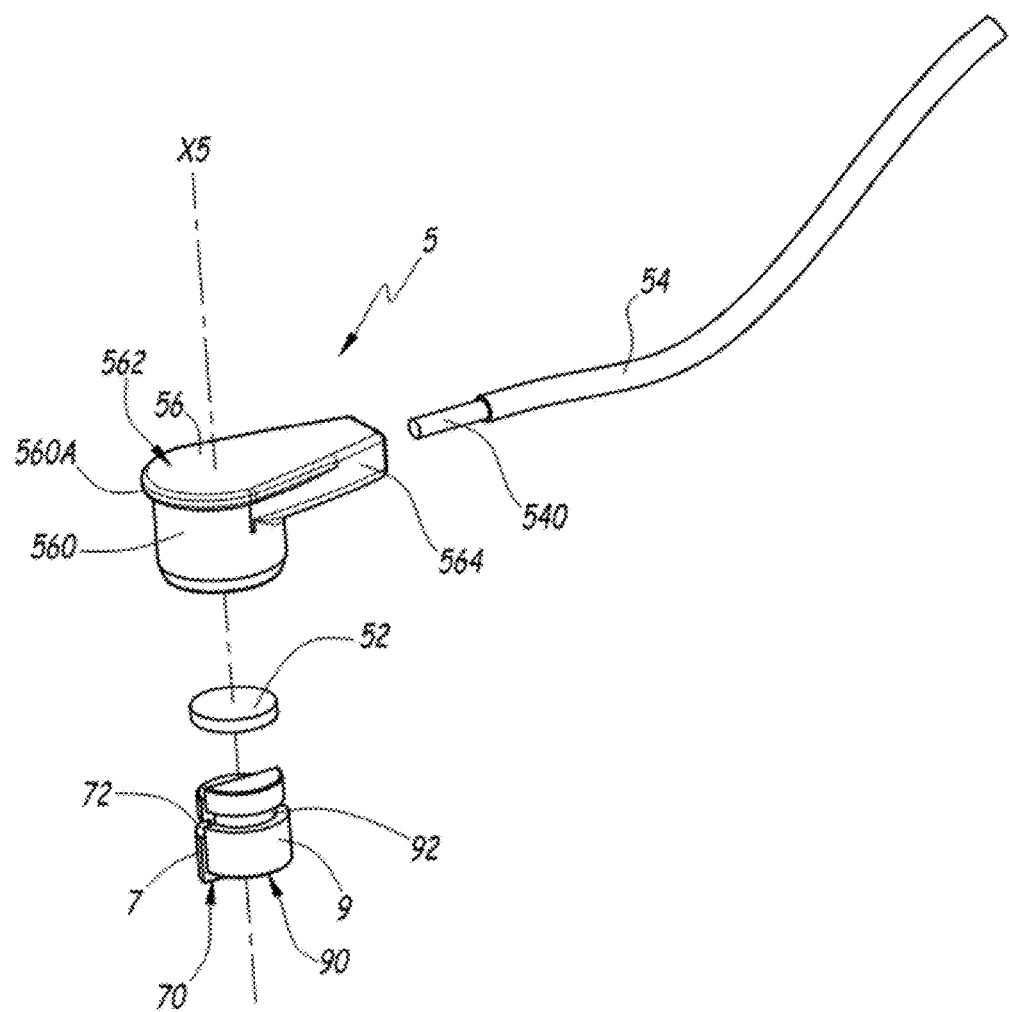
FIG. 10 is an exploded perspective view of the magnetic connector of FIG. 9.

A second embodiment of the invention is represented in FIGS. 9 and 10. In this embodiment, the elements that are common to the first embodiment bear the same references and operate in the same way.

In this embodiment, the connector 5 comprises two magnets 7 and 9 of reverse polarities. The two magnets 7 and 9 are preferably of semicylindrical form separated from one another by a wall 566 made of a single piece with the plastic cap 56. This wall 566 makes it possible to ensure the magnetic and physical isolation of the two magnets 7 and 9. The wall 566 is aligned with the central axis X5.

Each of the magnets 7 and 9 has a respective semi-circular contact surface 70 and 90, and a respective peripheral groove 72 and 92.

According to variant that is not represented, the conductive metal part 52 can have two positioning housings for the magnets 7 and 9 in order to ensure that they are not attracted by magnetic force prior to their overmoulding in the plastic cap 56.

Figure 11:
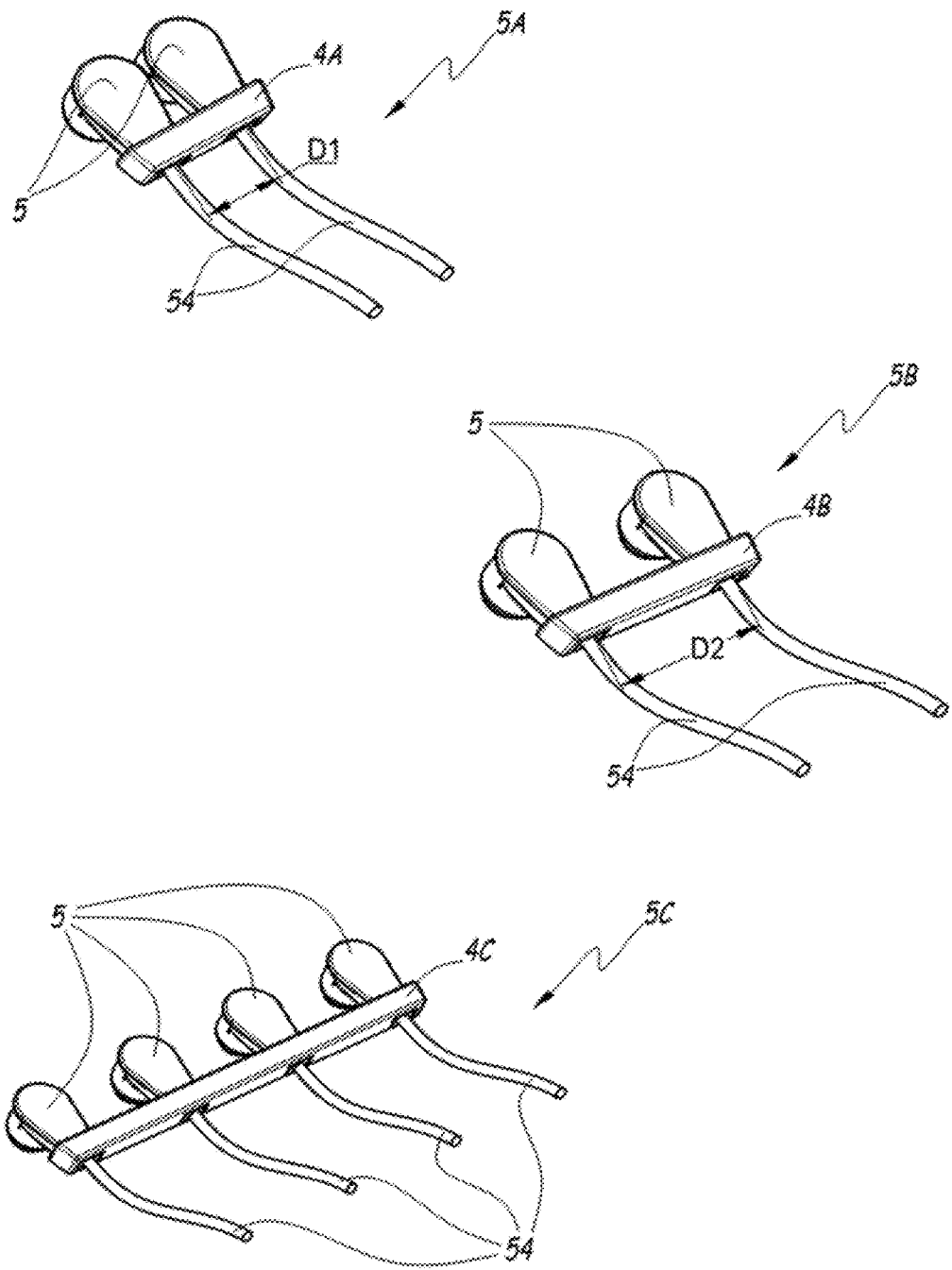
FIG. 11 is a perspective view of a set of three groups of connectors linked to one another by link parts.

A third embodiment of the invention is represented in FIG. 11. In this embodiment, several magnetic connectors 5 can be linked in parallel to several conductive parts 28 of the electrical consumer unit 22. These magnetic connectors 5 are grouped together in the form of groups of magnetic connectors comprising at least two connectors.

FIG. 11 illustrates a set of three groups of connectors 5A, 5B, and 5C. The first group of connectors 5A comprises two magnetic connectors 5 and a link part 4A which mechanically links these two magnetic connectors 5 to one another, for the mechanical hold, and to ensure an electrical safety distance D1 between them. The magnetic connectors 5 are fixed to the link part 4A by the clamping of the caps 56 of the magnetic connectors 5 into two clamps of the link part 4A.

The second group of connectors 5B comprises two magnetic connectors 5 and a link part 4B which mechanically links these two magnetic connectors 5 to one another, while maintaining an electrical safety distance D2, greater than the distance D1, for the case where the separation that is necessary between the connectors 5 to correspond with the separation of the conductive parts 28 is greater.

The third group of connectors 5C comprises four magnetic connectors 5 and a link part 4C which comprises four clamps each receiving one of the four magnetic connectors 5 while maintaining a separation between these four magnetic connectors.

The link parts 4A, 4B, 4C in FIG. 11 are illustrated by way of example, other link parts between the magnetic connectors 5 being able to be provided.

The invention claimed is:

1. A magnetic connector for connecting an electrical unit to an electrical consumer unit, the magnetic connector comprising at least one magnet, a conductive metal part secured to the magnet, a connecting cable fixed to the conductive metal part, and a cap made of plastic material overmoulded on the connecting cable, the conductive metal part and the magnet, except for a contact surface of the magnet that is configured to make direct contact with a metal part of the electrical consumer unit, wherein the cap made of plastic material has a longitudinal part extending along a central axis and terminated by a flat surface parallel to the contact surface of said at least one magnet, and wherein the cable is oriented transversely with respect to the longitudinal part and encapsulated in a radial part of the cap, wherein the radial part of the cap extends the flat surface.

2. The magnetic connector according to claim 1, comprising a single magnet of cylindrical form, the single magnet having a circumferential groove in which the material of the cap made of plastic material is engaged.

3. The magnetic connector according to claim 1, comprising two magnets of reverse polarities.

4. The magnetic connector according to claim 3, wherein the two magnets are of semicylindrical form and separated from one another by a wall made of a single piece with the cap.

5. The magnetic connector according to claim 1, wherein the longitudinal part comprises at least one peripheral gripping ridge provided in an extension of the radial part of the cap.

6. The magnetic connector according to claim 1, wherein the longitudinal part is of cylindrical form and has at least one longitudinal bulge so as to produce friction in a housing of the electrical consumer unit when the connector is connected in the housing of the electrical consumer unit.

7. The magnetic connector according to claim 6, wherein the longitudinal part has two longitudinal bulges diametrically opposite one another so as to produce friction in the housing of the electrical consumer unit when the connector is connected in the housing of the electrical consumer unit.

8. The magnetic connector according to claim 6, wherein the longitudinal part has an elliptical transverse profile, of which the greatest dimension has a length, with respect to the smallest dimension, that is greater by 0.2 to 0.4 mm.

9. The magnetic connector according to claim 1, wherein the longitudinal dimension of the connector, taken between the contact surface of the magnet and the flat surface of the cap, is between 7 and 12 mm.

10. A set of magnetic connectors, comprising at least two magnetic connectors, wherein each of the magnetic connectors is for connecting an electrical unit to an electrical consumer unit, each of the magnetic connectors comprising at least one magnet, a conductive metal part secured to the magnet, a connecting cable fixed to the conductive metal part, and a cap made of plastic material overmoulded on the connecting cable, the conductive metal part and the magnet, except for a contact surface of the magnet that is configured to make direct contact with a metal part of the electrical consumer unit, each of the magnetic connectors being intended to be connected to a metal part of the electrical consumer unit, the set of magnetic connectors further comprising a link part to which each of the magnetic connectors is fixed with a predefined separation.

11. A magnetic connector for connecting an electrical unit to an electrical consumer unit, the magnetic connector comprising at least two magnets of reverse polarities, a conductive metal part secured to the magnets, a connecting cable fixed to the conductive metal part, and a cap made of plastic material overmoulded on the connecting cable, the conductive metal part and the magnets, except for a contact surface of the magnets that is configured to make direct contact with a metal part of the electrical consumer unit, wherein the two magnets are of semicylindrical form and separated from one another by a wall made of a single piece with the cap.

* * * * *